United States Patent
Zhang et al.

(10) Patent No.: US 12,205,895 B2
(45) Date of Patent: Jan. 21, 2025

(54) THREE-DIMENSIONAL MEMORY DEVICE HAVING STAIRCASE STRUCTURE AND METHOD FOR FORMING THE SAME

(71) Applicant: YANGTZE MEMORY TECHNOLOGIES CO., LTD., Wuhan (CN)

(72) Inventors: Zhong Zhang, Wuhan (CN); Wenxi Zhou, Wuhan (CN); Di Wang, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 450 days.

(21) Appl. No.: 17/539,834

(22) Filed: Dec. 1, 2021

(65) Prior Publication Data
US 2023/0133874 A1    May 4, 2023

Related U.S. Application Data

(63) Continuation of application No. PCT/CN2021/127754, filed on Oct. 30, 2021.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76805* (2013.01); *H01L 21/76816* (2013.01);
(Continued)

(58) Field of Classification Search
CPC .............. H01L 23/5283; H01L 23/5226; H01L 23/53257; H01L 23/535; H01L 21/76805;
(Continued)

(56) References Cited

U.S. PATENT DOCUMENTS

| 2011/0031630 A1* | 2/2011 | Hashimoto | H10B 43/20 257/E21.585 |
|---|---|---|---|
| 2015/0061136 A1 | 3/2015 | Yoo et al. | |

(Continued)

FOREIGN PATENT DOCUMENTS

| CN | 111033729 A | 4/2020 |
|---|---|---|
| CN | 111919299 A | 11/2020 |

OTHER PUBLICATIONS

International Search Report issued in corresponding International Application No. PCT/CN2021/127754, mailed Jul. 27, 2022, 4 pages.

*Primary Examiner* — Britt D Hanley
*Assistant Examiner* — Vicki B. Booker
(74) *Attorney, Agent, or Firm* — BAYES PLLC

(57) ABSTRACT

A three-dimensional (3D) memory device includes interleaved conductive layers and dielectric layers. Edges of the conductive layers and dielectric layers define a plurality of stairs. The 3D memory device may also include a plurality of landing structures each disposed on a respective conductive layer at a respective stair. Each of the landing structures comprises a first layer of a first material and a second layer of a second material. The first layer is over the second layer. The second material is different from the first material.

20 Claims, 16 Drawing Sheets

(51) Int. Cl.
*H01L 23/522* (2006.01)
*H01L 23/532* (2006.01)
*H01L 23/535* (2006.01)

(52) U.S. Cl.
CPC .... *H01L 21/76895* (2013.01); *H01L 23/5226* (2013.01); *H01L 23/53257* (2013.01); *H01L 23/535* (2013.01)

(58) Field of Classification Search
CPC ........ H01L 21/76816; H01L 21/76895; H10B 43/27; H10B 43/50
See application file for complete search history.

(56) References Cited

U.S. PATENT DOCUMENTS

| | | | | |
|---|---|---|---|---|
| 2015/0325587 | A1* | 11/2015 | Chen | H01L 23/528 |
| | | | | 257/314 |
| 2017/0271256 | A1* | 9/2017 | Inatsuka | H01L 21/76816 |
| 2017/0338240 | A1* | 11/2017 | Nogami | H10B 43/35 |
| 2019/0081070 | A1 | 3/2019 | Lu et al. | |
| 2020/0051983 | A1* | 2/2020 | Zhang | G11C 16/04 |
| 2021/0287989 | A1* | 9/2021 | Greenlee | H10B 43/35 |

* cited by examiner

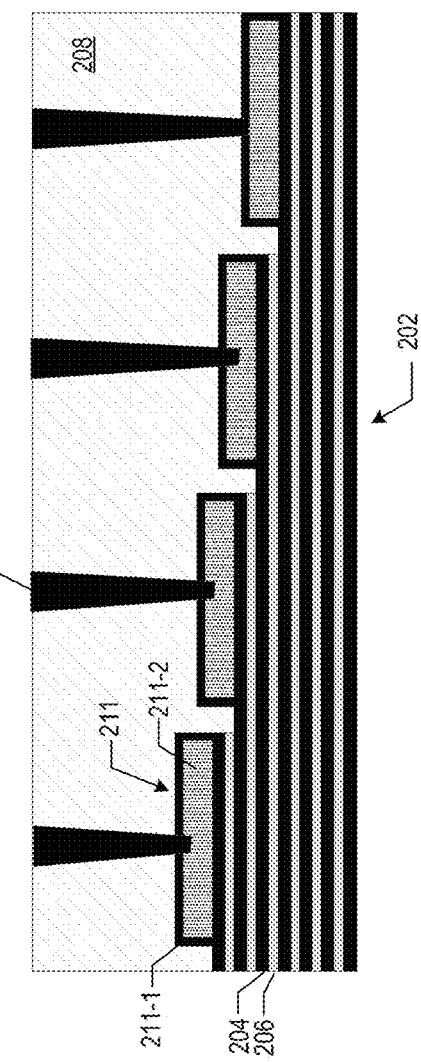
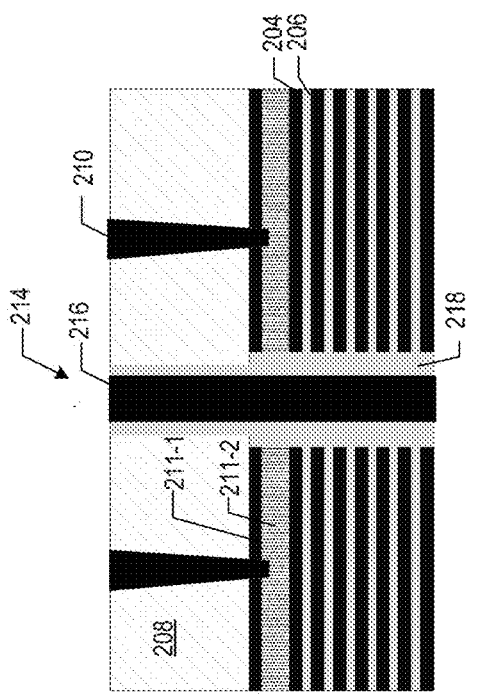
FIG. 2D
FIG. 2E

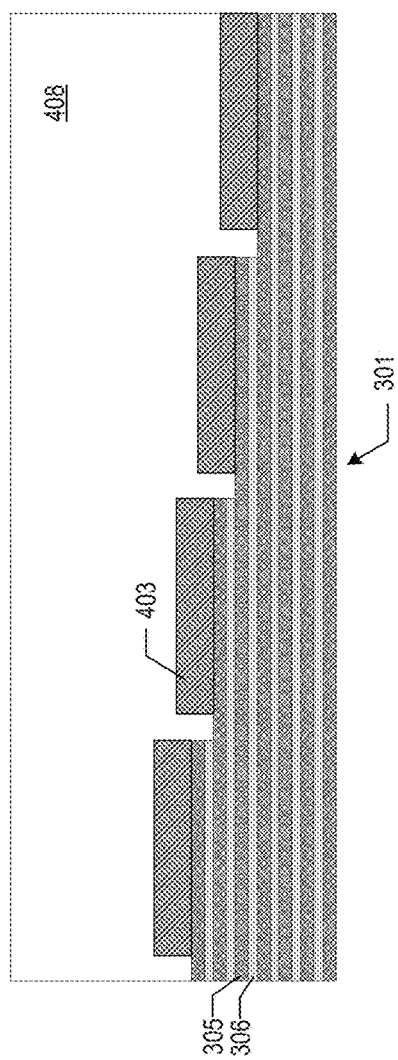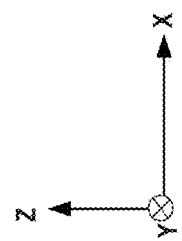
FIG. 4A
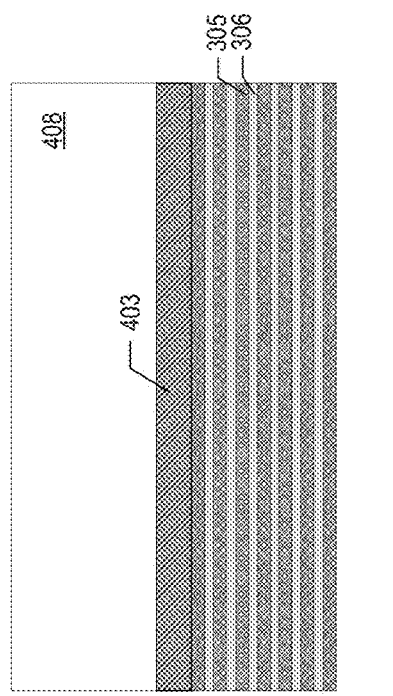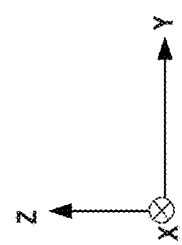
FIG. 4B

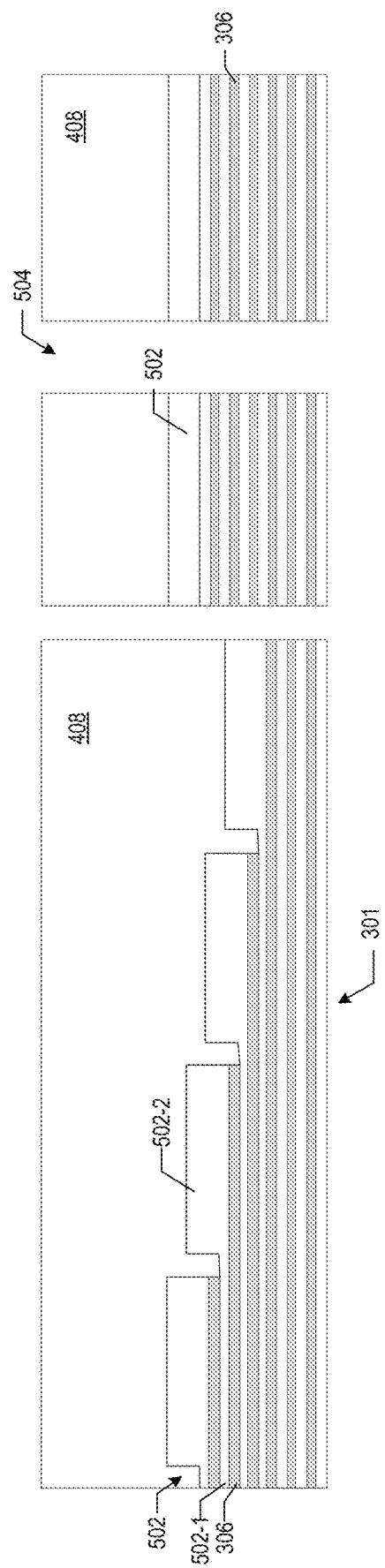
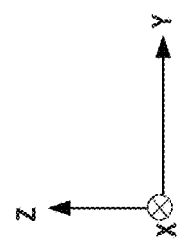
FIG. 5B
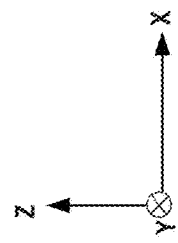
FIG. 5A

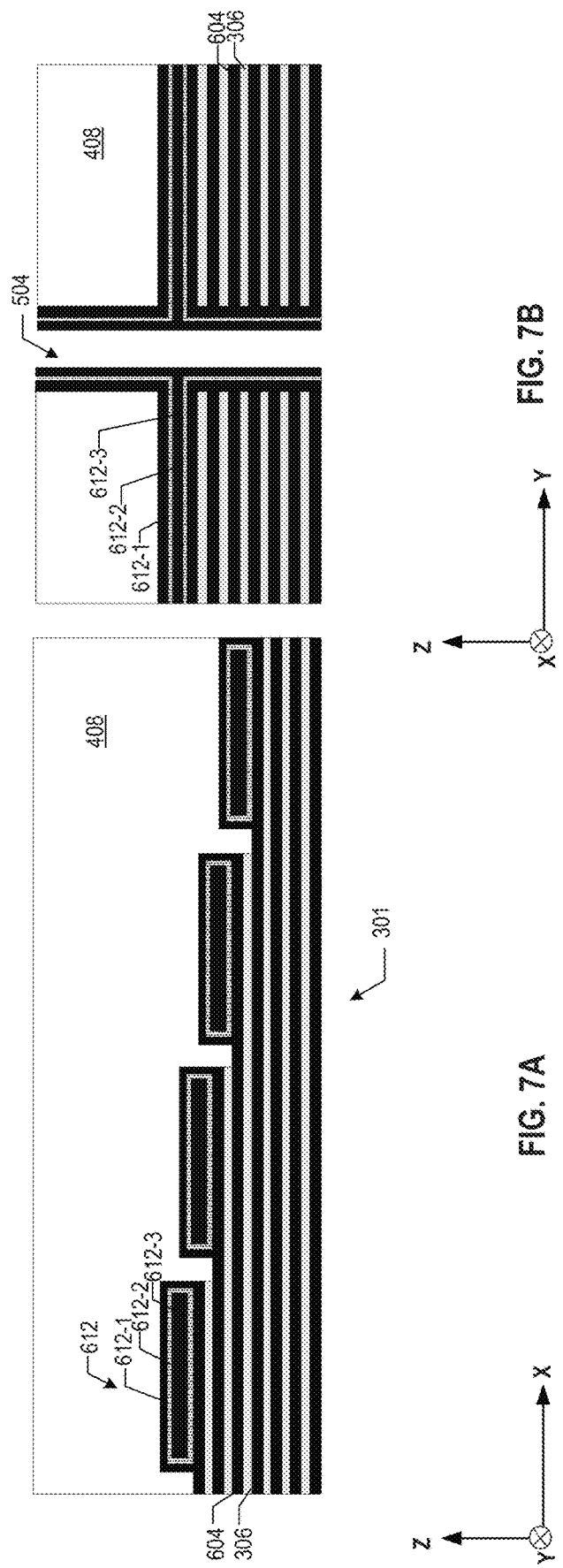

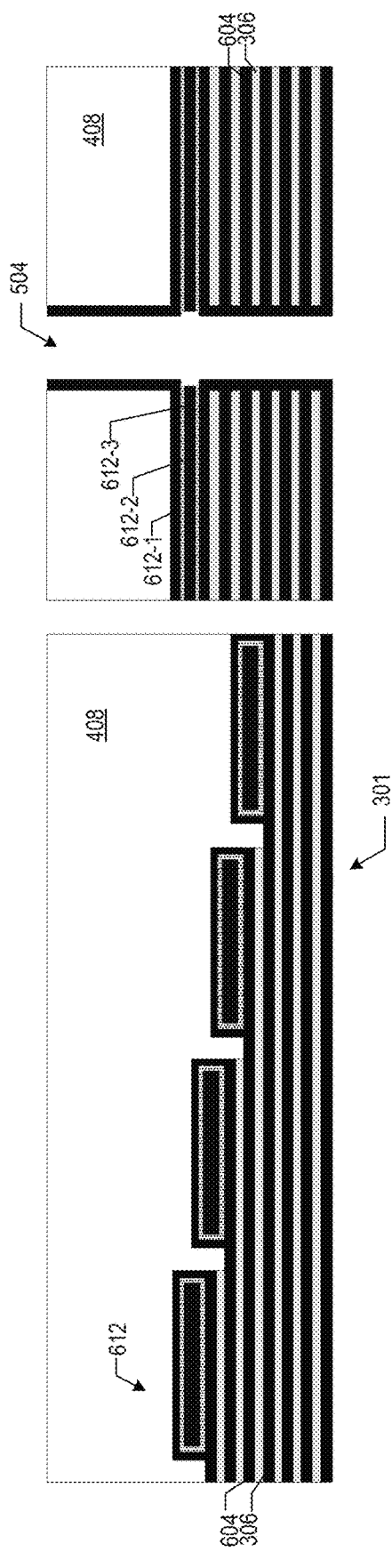
FIG. 8A
FIG. 8B

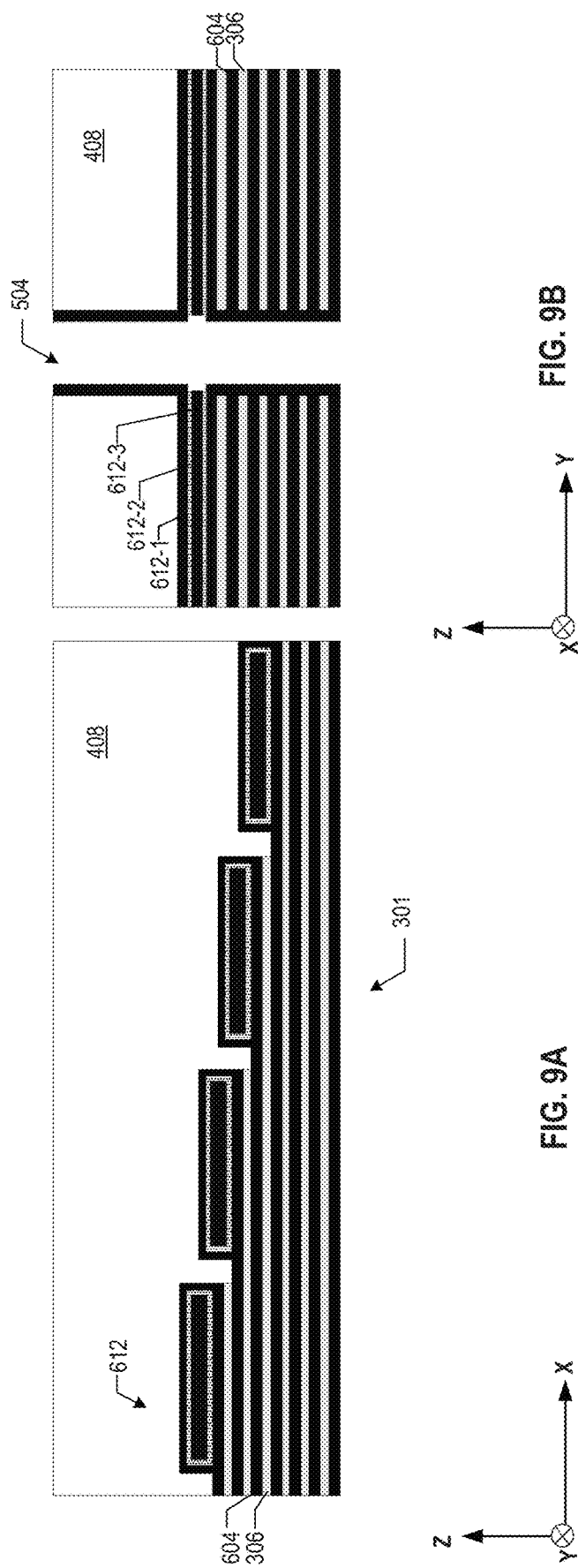

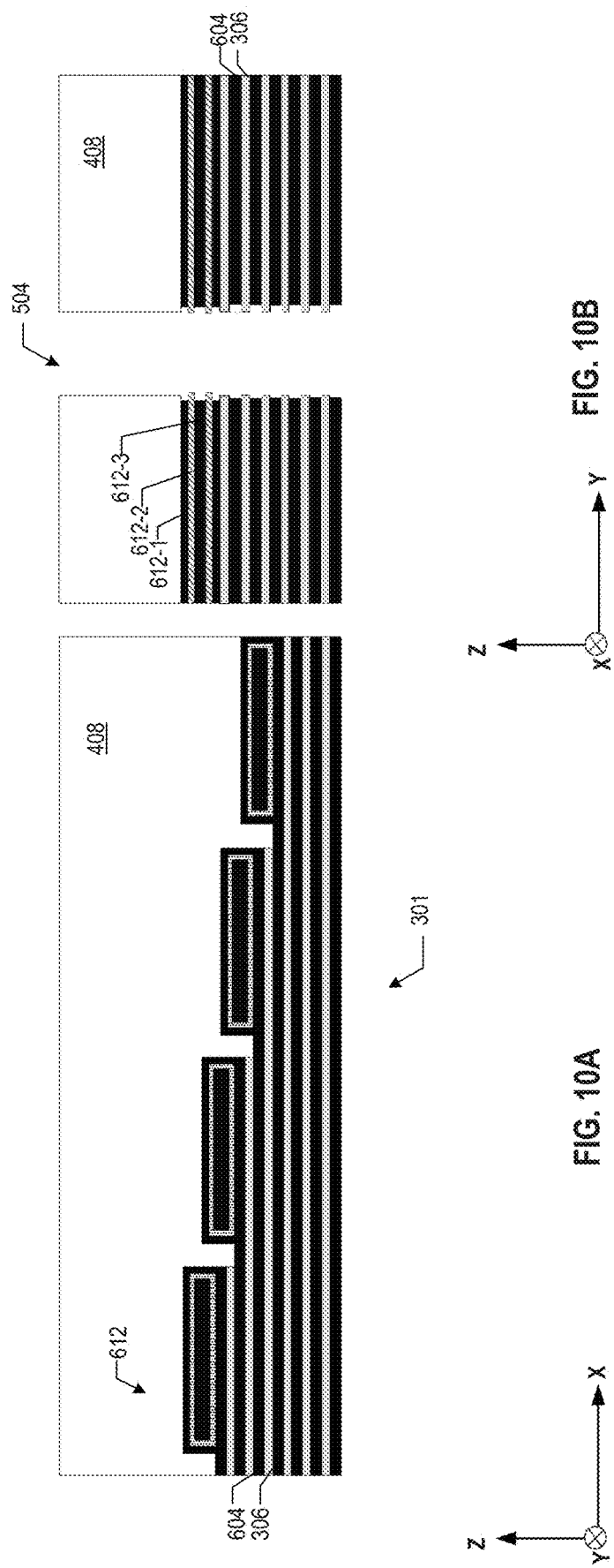

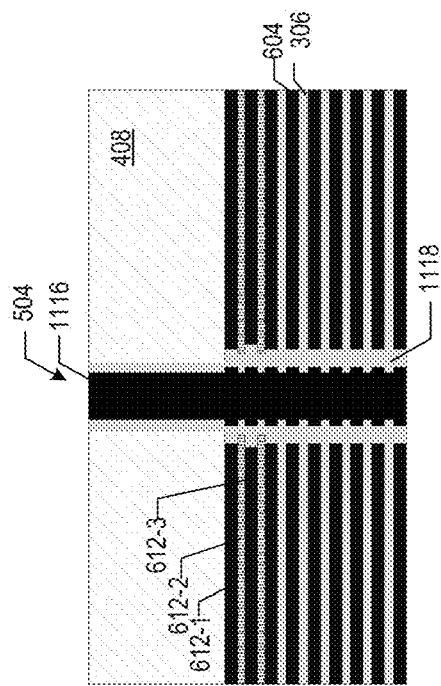
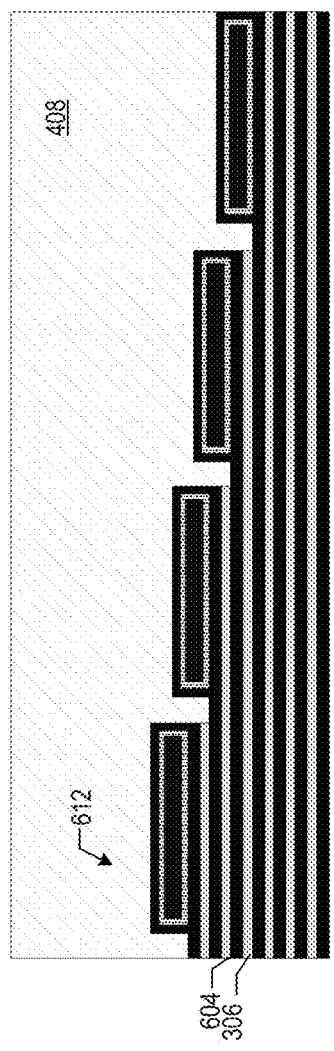
FIG. 11A
FIG. 11B

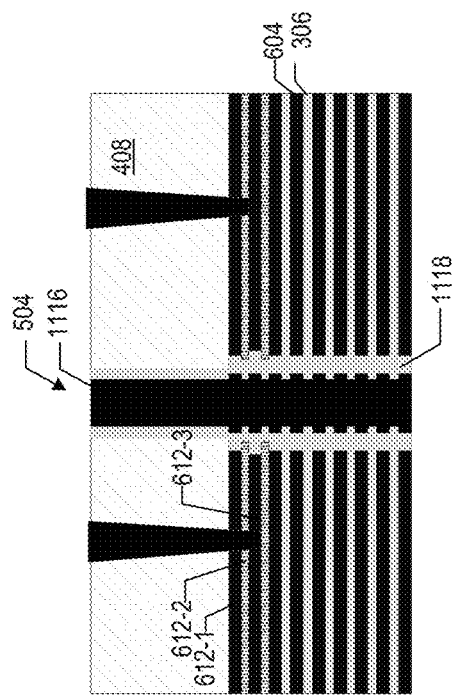
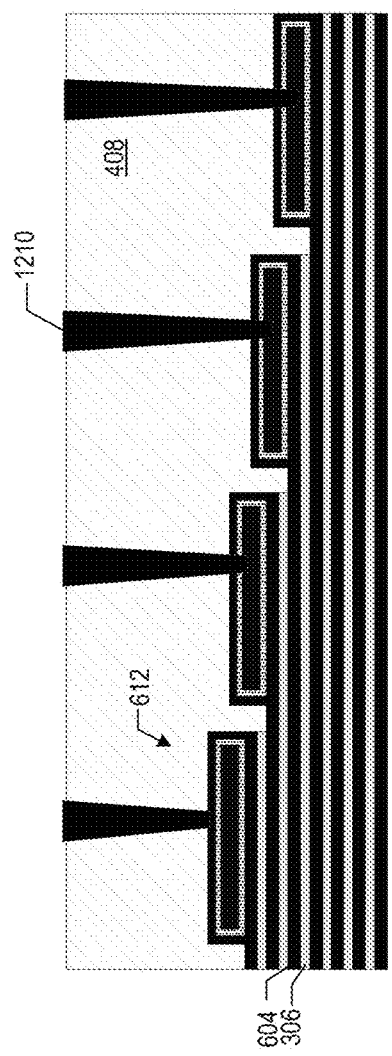
FIG. 12A
FIG. 12B

THREE-DIMENSIONAL MEMORY DEVICE HAVING STAIRCASE STRUCTURE AND METHOD FOR FORMING THE SAME

CROSS-REFERENCE TO RELATED APPLICATIONS

This application is continuation of International Application No. PCT/CN2021/127754, filed on Oct. 30, 2021, entitled "THREE-DIMENSIONAL MEMORY DEVICE HAVING STAIRCASE STRUCTURE AND METHOD FOR FORMING THE SAME," which is hereby incorporated by reference in its entirety.

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

SUMMARY

In one aspect, a 3D memory device includes interleaved conductive layers and dielectric layers. Edges of the conductive layers and dielectric layers define a plurality of stairs. The 3D memory device may also include a plurality of landing structures each disposed on a respective conductive layer at a respective stair. Each of the landing structures comprises a first layer of a first material and a second layer of a second material. The first layer is over the second layer. The second material is different from the first material.

In another aspect, a memory system includes a 3D memory device that includes interleaved conductive layers and dielectric layers. Edges of the conductive layers and dielectric layers define a plurality of stairs. The 3D memory device also includes a plurality of landing structures each disposed on a respective conductive layer at a respective stair. Each of the landing structures comprises a first layer of a first material and a second layer of a second material. The first layer is over the second layer. The second material is different from the first material. The memory system may also include a memory controller coupled to the 3D memory device and configured to control operations of the 3D memory device.

In still another aspect, a method for forming a 3D memory device includes the following operations. A stack structure having interleaved sacrificial layers and dielectric layers is formed. Edges of the sacrificial layers and dielectric layers define a plurality of stairs. Sacrificial portions are formed each in contact with a respective sacrificial layer. The sacrificial portions and the sacrificial layers are removed to form lateral recesses each having a first recess portion and a second recess portion over and in contact in contact with the first recess portion. A first material is deposited into each of the lateral recesses to fill the first recess portion and form a first layer in the second recess portion. A second material is deposited into the second recess portion to form a second layer over the first layer in the second recess portion.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIGS. 2D and 2E each illustrates a cross-sectional view of another example of the 3D memory device in FIG. 2A, according to some aspects of the present disclosure.

FIGS. 3A, 3B, 4A, 4B, 5A, 5B, 6A, 6B, 7A, 7B, 8A, 8B, 9A, 9B, 10A, 10B, 11A, 11B, 12A, 12B illustrate cross-sectional views of an exemplary 3D memory device at different stages of a fabrication process, according to some aspects of the present disclosure.

Figure 1:
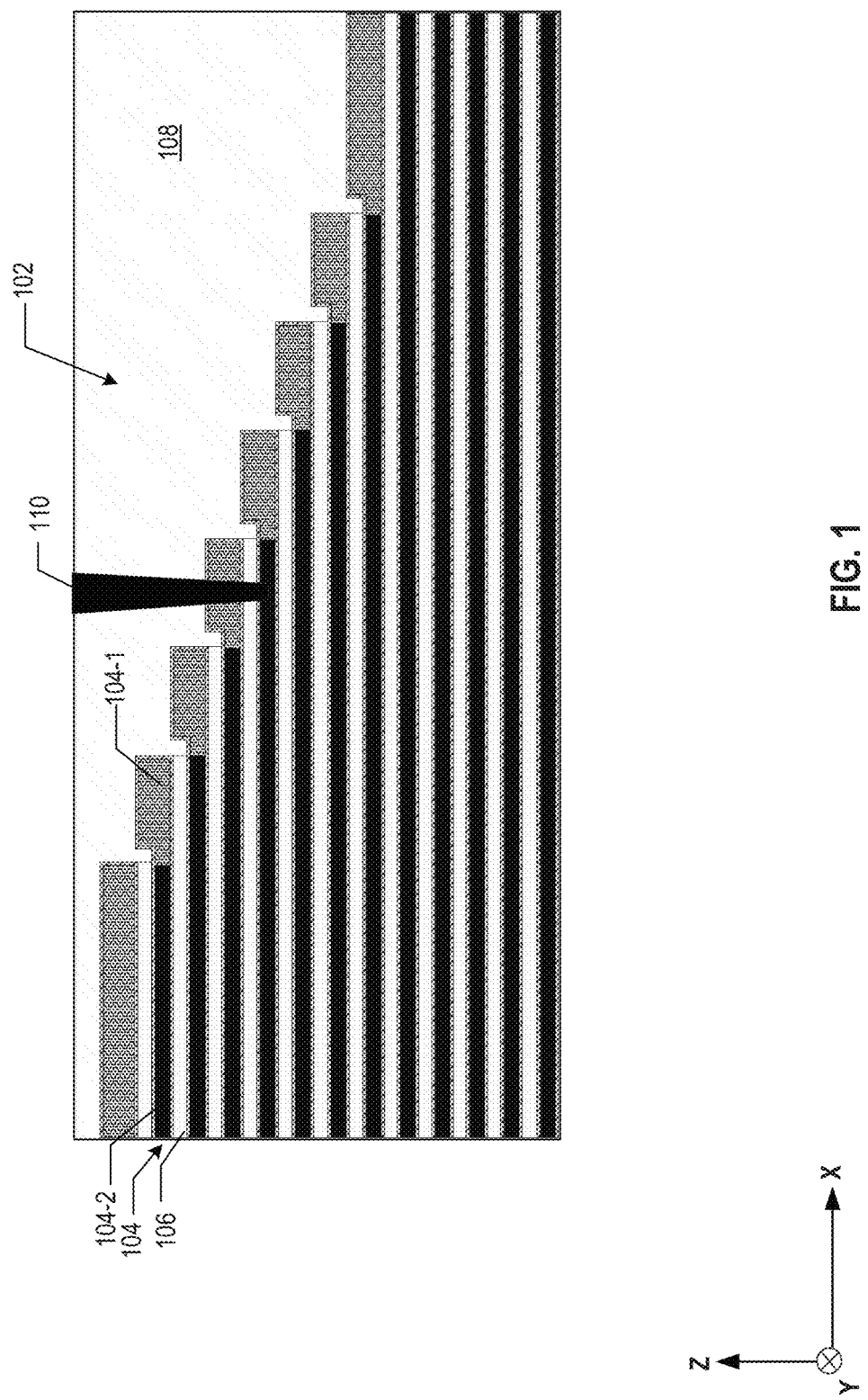
FIG. 1 illustrates a cross-section of a 3D memory device.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In a 3D memory device, such as a 3D NAND memory device, a stack of interleaved conductive layers and dielectric layers (e.g., a memory stack) may be arranged over a substrate, and a plurality of channel structures extending through and intersecting with the conductive layers. The memory stack can be formed by replacing the sacrificial layers in a dielectric stack of interleaved sacrificial layers and dielectric layers with conductive layers in a gate replacement process. Memory cells are formed by the intersection between the conductive layers and the channel structures. Some of the conductive layers function as the word lines of the 3D NAND memory device, and are arranged in a plurality of stairs. Each of the stairs includes a top conductive layer having a landing area on which a word line contact is landed. The word line contact applies voltages on the top conductive layer for the operation of the 3D NAND memory device.

As the demand for higher capacity continues to increase, the number of conductive layers, e.g., word lines, increases in a 3D NAND memory device. The increase of the number of conductive layers results in an increase of height of the stack, and the fabrication process to form the word line contacts become more challenging. For example, the word line contacts are formed by forming openings in a dielectric structure over the stairs and fill the openings with a conductive material. The openings, in contact with the top conductive layers of respective stairs, are often formed in the same patterning process. Due to the different elevations of the stairs, the etching can cause the top conductive layer in a higher stair to be over etched more, and that in a lower stair to be over etched less or even under etched. The overetching of the top conductive layer can result in the opening being in contact with an underlying conductive layer, e.g., causing a "punch through" phenomenon. When the word line contacts are formed, the conductive material of the word line contacts may leak into the damaged underlying conductive layers, causing short circuits and/or leakage.

To reduce the possibility of damaging the top conductive layers, the landing area of a top conductive layer is thickened by forming an additional conductive portion. To form a top conductive layer with a conductive portion, a sacrificial portion is formed in contact with a respective sacrificial layer in the landing area of the respective stair. In a gate replacement process, a gate-line slit is formed in the stack, the sacrificial portion and the sacrificial layer are then both removed through the gate-line slit to form a lateral recess, and a conductive material is deposited through the gate-line slit to fill in the lateral recess. The portion of the lateral recess at the landing area is thus thicker than the rest of the lateral recess. To fully fill the lateral recess at the landing area, a larger amount of conductive material, e.g., tungsten, needs to be deposited. The larger amount of conductive material can form a thick layer of conductive material on the sidewall of the gate-line slit. The thick layer of the conductive material can be difficult to remove completely during the recess etch (to remove excess conductive material) in the formation of a source contact structure in the gate-line slit. Conductive residual can remain on the sidewall of the gate-line slit, causing short circuits between adjacent conductive layers. On the other hand, if less conductive material is deposited to avoid a thick layer, the lateral recess in the landing area may not be fully filled, and there may not enough conductive material is deposited to sustain the subsequent recess etch (to remove the excess conductive material) in the formation of the source contact structure. The lateral recess in the landing area can thus be partially or fully hollow. When the word line contacts are formed, the punch-through phenomenon is more likely to occur, and the 3D NAND memory device is more susceptible to short circuits/leakage.

FIG. 1 illustrates a cross-sectional view of a 3D memory device 100 in which a top conductive layer is at least partially hollow at the landing area due to the reasons described above. 3D memory device 100 includes a stack structure 102 having interleaved a plurality of conductive layers 104 and dielectric layers 106 over a substrate (not shown). The edges of conductive layers 104 and dielectric layers 106 may define a plurality of stairs. Each of the stairs includes one of conductive layers 104 as the top conductive layer and an underlying dielectric layer 106. 3D memory device 100 also includes a dielectric structure 108 over the stairs and a plurality of word line contacts 110 in dielectric structure 108. Each word line contact 110 is in contact with the landing area of a respective conductive layer 104 of a respective stair. For illustrative purposes, one word line contact 110 is shown.

As shown in FIG. 1, conductive layer 104 may include a first portion 104-1 and a second portion 104-2 in contact with each other. Second portion 104-2 includes a conductive material such as tungsten. First portion 104-1 includes any conductive material in a recess portion formed by the removal of a sacrificial portion and part of the underlying sacrificial layer. The conductive material that fills conductive layer 104 is deposited through a gate-line slit. The recess portion may not be fully filled in a gate-replacement process. In the fabrication process to form source contact structures, a recess etching is performed to remove excess conductive material from the sidewall of a gate-line slit, and the recess etching can remove part of all of the conductive material in the recess portion. First portion 104-1 can thus be partially or fully hollow. During the formation of the opening in which word line contact 110 is formed, dielectric structure 108 is etched. The etching can cause the opening to extend into or through first portion 104-1, which is partially or fully hollow. The deposited conductive material to fill the opening is then more likely to be in contact with an underlying conductive layer 104. On the other hand, if the recess portion is fully filled with one layer of the conductive material (not shown), the conductive material deposited on the gate-line slit can be too thick to remove. The conductive residual can cause short circuits between conductive layers.

The present disclosure provides a 3D memory device and a fabrication method to form the 3D memory device. The 3D memory device includes a memory stack that has a plurality of stairs extending on at least one side of a stack of interleaved conductive layers and dielectric layers (e.g., a memory stack). The 3D memory device includes a landing structure disposed on the respective conductive layer at the top surface of a respective stair. The landing structure has a first layer and a second layer underlying the first layer. The first layer includes a conductive material, such as tungsten. The second layer includes a different material than the first layer. In some implementations, the second layer includes silicon oxide, silicon nitride, silicon oxynitride, polysilicon, or any combinations thereof. The first layer surrounds the second layer and is in contact with the underlying conductive layer. In some implementations, the first layer extends on the side surfaces of the landing structure, and the second layer fills the rest of the landing structure. In some other implementations, the 3D memory device also includes a third layer surrounded by the second layer. The third layer fills the rest of the landing structure. The third layer also includes a conductive material, such as the same material as the first layer, or another material different from the first material.

The landing structure, having a conductive first layer, allows a word line contact, once in contact with the landing structure, to be conductively connected to the respective conductive layer. The word line contact can stop at any depth in the landing structure and be conductively connected to the respective conductive layer. In the meantime, the first material only partially fills the landing structure and does not form an undesirably thick single layer on the sidewall of a slit structure through which the first material is deposited. The second material, formed over the first material on the sidewall of the slit structure, can be easily removed. The removal of the first material can thus be easier. Even if a third layer of the third material (e.g., a conductive material) is formed on the sidewall of the slit structure and to fill the landing structure, layers of the third material and the first material are separated by a layer of the second material. The thickness of each of the first, second, and third layers can be desirably thin to facilitate the complete removal of excess conductive material(s) on the sidewall of the slit structure. On the other hand, the thickness of the first layer is sufficiently thick to provide high conductivity between the word line contact and the respective conductive layer. The short circuits between adjacent conductive layers caused by the conductive residual on the sidewall of the slit structure can be reduced or prevented.

Figure 2A:
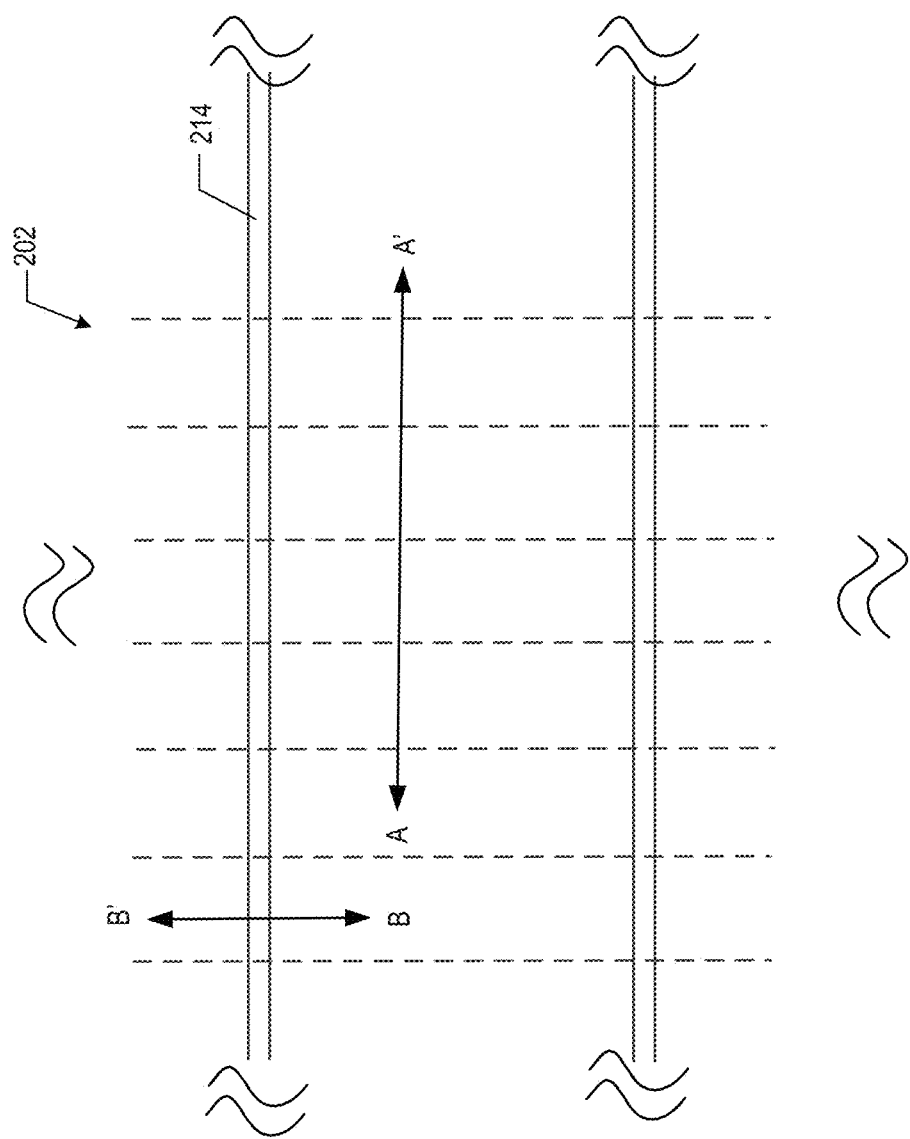
FIG. 2A illustrates a top view of an exemplary 3D memory device, according to some aspects of the present disclosure.
Figures 2B, 2C:
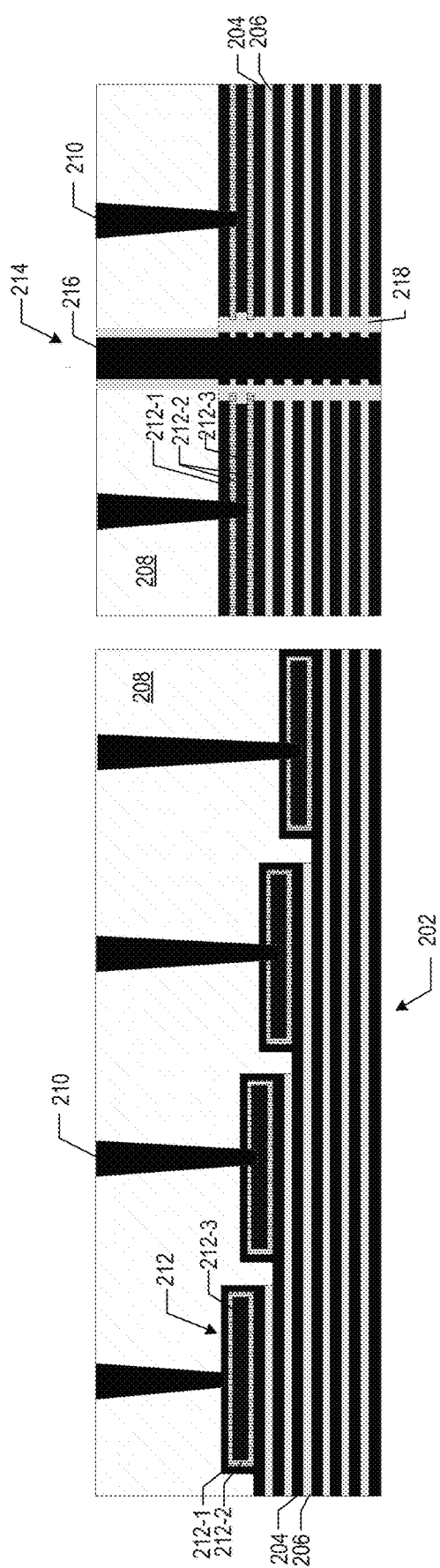
FIGS. 2B and 2C each illustrates a cross-sectional view of an example of the 3D memory device in FIG. 2A, according to some aspects of the present disclosure.

FIGS. 2A-2E illustrate part of 3D memory device 200 and 201, according to some aspects of the present disclosure. 3D memory device 200 and 201 may each be a 3D NAND memory device. FIG. 2A illustrates a top view of part of 3D memory device 200 and 201. FIG. 2B illustrates a cross-sectional view of part of 3D memory device 200 in the A-A' direction. FIG. 2C illustrates a cross-sectional view of part of 3D memory device 200 in the B-B' direction. FIG. 2D illustrates a cross-sectional view of part of 3D memory device 201 in the A-A' direction. FIG. 2E illustrates a cross-sectional view of part of 3D memory device 201 in the B-B' direction.

3D memory device 200 may include a stack structure 202 over a substrate (not shown). The substrate may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, the substrate is a thinned substrate (e.g., a semiconductor layer), which was thinned by grinding, etching, chemical mechanical polishing (CMP), or any combination thereof. It is noted that x and y axes are included in the figures of the present disclosure to further illustrate the spatial relationship of the components in 3D memory device 200. The substrate of 3D memory device 200 includes two lateral surfaces (e.g., a top surface and a bottom surface) extending laterally in the x- and y-directions (i.e., the lateral direction), which are orthogonal to the z-direction (i.e., the vertical direction). As used herein, whether one component (e.g., a layer or a device) is "on," "above," or "below" another component (e.g., a layer or a device) of a 3D memory device (e.g., 3D memory device 200) is determined relative to the substrate of the 3D memory device in the z-direction (i.e., the vertical direction) when the substrate is positioned in the lowest plane of the 3D memory device in the z-direction. The same notion for describing spatial relationships is applied throughout the present disclosure.

3D memory device 200 may be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 may be part of a non-monolithic 3D memory device, in which components (e.g., the peripheral device and memory array device) may be formed separately on different substrates and then bonded, for example, in a face-to-face manner. In some implementations, the memory array device substrate (e.g., the substrate of 3D memory device 200) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some implementations, the memory array device substrate is flipped and faces down toward the peripheral device (not shown) for hybrid bonding, so that in the bonded non-monolithic 3D memory device, the memory array device is above the peripheral device. The memory array device substrate may be a thinned substrate (which is not the substrate of the bonded non-monolithic 3D memory device), and the back-end-of-line (BEOL) interconnects of the non-monolithic 3D memory device may be formed on the backside of the thinned memory array device substrate.

In some implementations, 3D memory device 200 is a NAND Flash memory device in which memory cells are provided in the form of an array of NAND memory strings (not shown) each extending vertically above the substrate. As shown in FIG. 1, 3D memory device 200 may include a stack structure 202 formed on the substrate, and NAND memory string may include a channel structure (not shown) extending vertically through the stack structure in the z-direction. Stack structure 202 includes interleaved a plurality of conductive layers 204 and a plurality of dielectric layers 206. Conductive layers 204 may include at least one source select gate line, a plurality of word lines, and at least one drain select gate line.

Stack structure 202 may include a plurality of interleaved conductive layers 204 and dielectric layers 206 stacked in the z-direction. As shown in FIGS. 2A-2C, edges of conductive layers 204 and dielectric layers 206 form a plurality of stairs extending in the x-direction. In FIG. 2A, the stairs are illustrated in dashed lines. In some implementations, a pair of conductive layer 204 and an underlying dielectric layer 206 are arranged in a stair. In some implementations, more than one pair of conductive layers 204 and dielectric layers 206 are arranged in a stair. Conductive layers 204 may each include conductive materials including, but not limited to, tungsten (W), cobalt (Co), copper (Cu), aluminum (Al), polysilicon, doped silicon, silicides, or any combination thereof. Dielectric layers 206 may each include dielectric materials including, but not limited to, silicon oxide, silicon nitride, silicon oxynitride, or any combination thereof.

3D memory device 200 may include a dielectric structure 208 disposed over the stairs. A plurality of word line contacts 210 may be extending in dielectric structure 208. Each word line contact 210 may be landed on a respective stair. Word line contacts 210 may apply word line voltages on conductive layers 204 for the operation of 3D memory device 200. Word line contacts 210 may each include conductive materials including, but not limited to, tungsten (W), cobalt (Co), copper (Cu), aluminum (Al), polysilicon, doped silicon, silicides, or any combination thereof. Dielectric structure 208 may each include dielectric materials including, but not limited to, silicon oxide, silicon nitride, silicon oxynitride, or any combination thereof.

As shown in FIGS. 2B and 2C, 3D memory device 200 may also include a plurality of landing structures 212 each disposed on a respective stair. Specifically, landing structure 212 may be in contact with and conductively connected to a respective (e.g., top) conductive layer 204 on the top surface of the respective stair. Landing structure 212 may include a first layer 212-1 and a second layer 212-2 under first layer 212-1. First layer 212-1 may include a first material, e.g., a conductive material including, but not limited to, tungsten (W), cobalt (Co), copper (Cu), aluminum (Al), polysilicon, doped silicon, silicides, or any combination thereof. For example, the first material includes tungsten. Second layer 212-2 may include a second material different from the first material. For example, the second material may include silicon oxide, silicon nitride, silicon oxynitride, polysilicon, or any combination thereof. For example, the second material includes silicon oxide.

As shown in FIG. 2B, first layer 212-1 may extend laterally (e.g., in the x-y plane) and vertically (e.g., in the z-direction). For example, first layer 212-1 may include a lateral portion and a pair of vertical portions. The lateral portion may be in contact with the vertical portions. First layer 212-1 may be in contact with the respective underlying conductive layer 204 through at least one vertical portion, e.g., both vertical portions. When word line contact 210 is in contact with landing structure 212, word line contact 210 is in contact with the lateral portion of landing structure 212, and is thus conductively connected to the respective underlying conductive layer 204.

Second layer 212-2 may be in contact with and surrounded by first layer 212-1 (e.g., by the lateral portion and the vertical portions of first layer 212-1). As shown in FIG. 2B, second layer 212-2 is surrounded by and in contact with first layer 212-1 and the respective underlying conductive layer 204. In some implementations, although not shown, second layer 212-2 fully fills the space formed/surrounded by first layer 212-1 and the respective underlying conductive layer 204. In other words, in addition to first layer 212-1, second layer 212-2 fills the rest of landing structure 212. When word line contact 210 is in contact with landing structure 212, word line contact 210 may or may not be in contact with second layer 212-2. However, because word line contact 210 is in contact with the lateral portion of first layer 212-1, word line contact 210 is thus conductively connected to the respective underlying conductive layer 204.

In some implementations, as shown in FIGS. 2B and 2C, second layer 212-2 may not fill the space formed by first layer 212-1 and the respective underlying conductive layer 204, and landing structure 212 includes a third layer 212-3 surrounded and in contact with second layer 212-2. Second layer 212-2 may be disposed on first layer 212-1, and third layer 212-3 may be disposed on second layer 212-2 and fills the space formed/surrounded by second layer 212-2. Third layer 212-3 may fill up the rest of the space formed by second layer 212-2 and provide sufficient support for the landing of word line contact 210. Third layer 212-3 may include a third material, e.g., a conductive material, including, but not limited to, tungsten (W), cobalt (Co), copper (Cu), aluminum (Al), polysilicon, doped silicon, silicides, or any combination thereof. In some implementations, third layer 212-3 includes the same material as the first material, e.g., tungsten. In some implementations, third layer 212-3 is different from the first material and the second material, and can be conductive or non-conductive. For example, third layer 212-3 may include W, Co, Al, Cu, silicides, polysilicon, silicon oxide, silicon nitride, silicon oxynitride, carbon, or any combination thereof. When word line contact 210 is in contact with landing structure 212, word line contact 210 may or may not be in contact with third layer 212-3. However, because word line contact 210 is in contact with the lateral portion of landing structure 212, word line contact 210 is thus conductively connected to the respective underlying conductive layer 204.

In some implementations, the first material includes tungsten, the second material includes silicon oxide, and the third material and the underlying conductive layer 204 each includes tungsten. In some implementations, the first material includes tungsten, the second material includes silicon nitride, and the third material and the underlying conductive layer 204 each includes tungsten. In some implementations, the first material includes tungsten, the second material includes polysilicon, and the third material and the underlying conductive layer 204 each includes tungsten.

As shown in FIGS. 2B and 2C, although landing structure 212 is not fully filled with the conductive material, e.g., tungsten, first layer 212-1 can facilitate electrical connection between word line contact 210 and the respective underlying conductive layer 204 when word line contact 210 is in contact with landing structure 212. When first layer 212-1 and third layer 212-3 are both formed, first layer 212-1 and third layer 212-3 are separated by second layer 212-2, which includes a material different from that of first and third layers 212-1 and 212-3. The formation of second layer 212-2 allows the thickness of each of first layer 212-1 and third layer 212-3 to be less than the thickness of landing structure 212. Even if first layer 212-1 and third layer 212-3 include the same material, such as tungsten, the thickness of each of first layer 212-1 and third layer 212-3 would not be undesirably thick on the sidewall of a slit structure. During the formation of the source contact structure (described below), the conductive material (e.g., deposited from the formation of first layer 212-1 and/or third layer 212-3) on the sidewall of the slit structure can thus be removed completely in a recess etch. Conductive layers 204 are less susceptible to short circuits due to conductive residual on the side surfaces of the slit structure.

FIGS. 2D and 2E illustrate 3D memory device 201 in which a second layer fully fills the space formed/surrounded by a first layer and the respective conductive layer. Different from 3D memory device 200, 3D memory device 201 includes a landing structure 211 that includes a first layer 211-1 of a first material and a second layer 211-2 of a second material. Second layer 211-2 may fully fill the space surrounded/formed by first layer 211-1 and the respective underlying conductive layer 204. In some implementations, second layer 211-2 is over and in contact with first layer 211-1 and the respective underlying conductive layer 204. The structure of material of first layer 211-1 may be similar to those of first layer 212-1 and the description is not repeated herein. The second material may be different from the first material and may include polysilicon, silicon oxide, silicon nitride, silicon oxynitride, carbon, or any combination thereof. In one example, the second material includes silicon nitride. In another example, the second material includes polysilicon (e.g., doped polysilicon and/or undoped polysilicon). Word line contact 210 may be in contact with first layer 211-1, and may or may not be in contact with second layer 211-1 and/or the underlying conductive layer 204. In some implementations, the first material includes tungsten, the second material includes silicon nitride, and the underlying conductive layer 204 includes tungsten. In some implementations, the first material includes tungsten, the second material includes polysilicon, and the underlying conductive layer 204 includes tungsten.

3D memory device 200/201 may also include one or more slit structures 214 extending in stack structure 202, e.g., in the x- and z-directions. Slit structures 214 may also be referred to as gate-line slits, in some implementations. A source contact structure may be formed in slit structure 214. The source contact structure may be part of the source of 3D memory device 200/201 and may apply source voltages on the 3D memory device 200/201. As shown in FIG. 2C, the source contact structure may include a dielectric spacer 218 and a source contact 216 in dielectric spacer 218. Source contact 216 may include conductive materials including, but not limited to, tungsten (W), cobalt (Co), copper (Cu), aluminum (Al), polysilicon, doped silicon, silicides, or any combination thereof. Dielectric spacer 218 may include dielectric materials including, but not limited to, silicon oxide, silicon nitride, silicon oxynitride, or any combination thereof.

In some implementations, conductive layers 204 function as gate conductors of memory cells in NAND memory string (not shown). Conductive layers 204 may extend laterally, coupling a plurality of memory cells. In some implementations, memory cell transistors in NAND memory string include a channel structure that has a semiconductor channel, a memory film (including a tunneling layer, a storage layer, and a blocking layer). The NAND memory strings can be located in a core array region of 3D memory device 200/201.

The channel structure may include a channel hole filled with semiconductor materials (e.g., as a semiconductor channel) and dielectric materials (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. In some implementations, the remaining space of the channel structure may be partially or fully filled with a filling layer including dielectric materials, such as silicon oxide. The channel structure may have a cylinder shape (e.g., a pillar shape). The filling layer, the semiconductor channel, the tunneling layer, the storage layer, and the blocking layer are arranged radially from the center toward the outer surface of the pillar in this order, according to some implementations. The tunneling layer may include silicon oxide, silicon oxynitride, or any combination thereof. The storage layer may include silicon nitride, silicon oxynitride, silicon, or any combination thereof. The blocking layer may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

In some implementations, the NAND memory string may further include a channel contact, or called semiconductor plug, in a lower portion (e.g., at the lower end) of NAND memory string below the channel structure. As used herein, the "upper end" of a component (e.g., NAND memory string) is the end farther away from the substrate in the z-direction, and the "lower end" of the component (e.g., NAND memory string) is the end closer to the substrate in the z-direction when the substrate is positioned in the lowest plane of 3D memory device 200/201. The channel contact may include a semiconductor material, such as silicon, which is epitaxially grown from the substrate in any suitable directions. It is understood that in some implementations, the channel contact includes single crystalline silicon, the same material as the substrate. In other words, the channel contact may include an epitaxially-grown or deposited semiconductor layer that is the same as the material of the substrate. In some implementations, part of the channel contact is above the top surface of the substrate and in contact with the semiconductor channel. The channel contact may function as a channel controlled by a source select gate of NAND memory string. It is understood that in some implementations, 3D memory device 200/201 does not include a channel contact.

In some implementations, NAND memory string further includes a channel plug in an upper portion (e.g., at the upper end) of NAND memory string. The channel plug may be in contact with the upper end of the semiconductor channel. The channel plug may include semiconductor materials (e.g., polysilicon). By covering the upper end of the channel structure during the fabrication of 3D memory device 200/201, the channel plug may function as an etch stop layer to prevent etching of dielectrics filled in the channel structure, such as silicon oxide and silicon nitride. In some implementations, the channel plug also functions as the drain of NAND memory string. It is understood that in some implementations, 3D memory device 100 does not include a channel plug.

Figure 13:
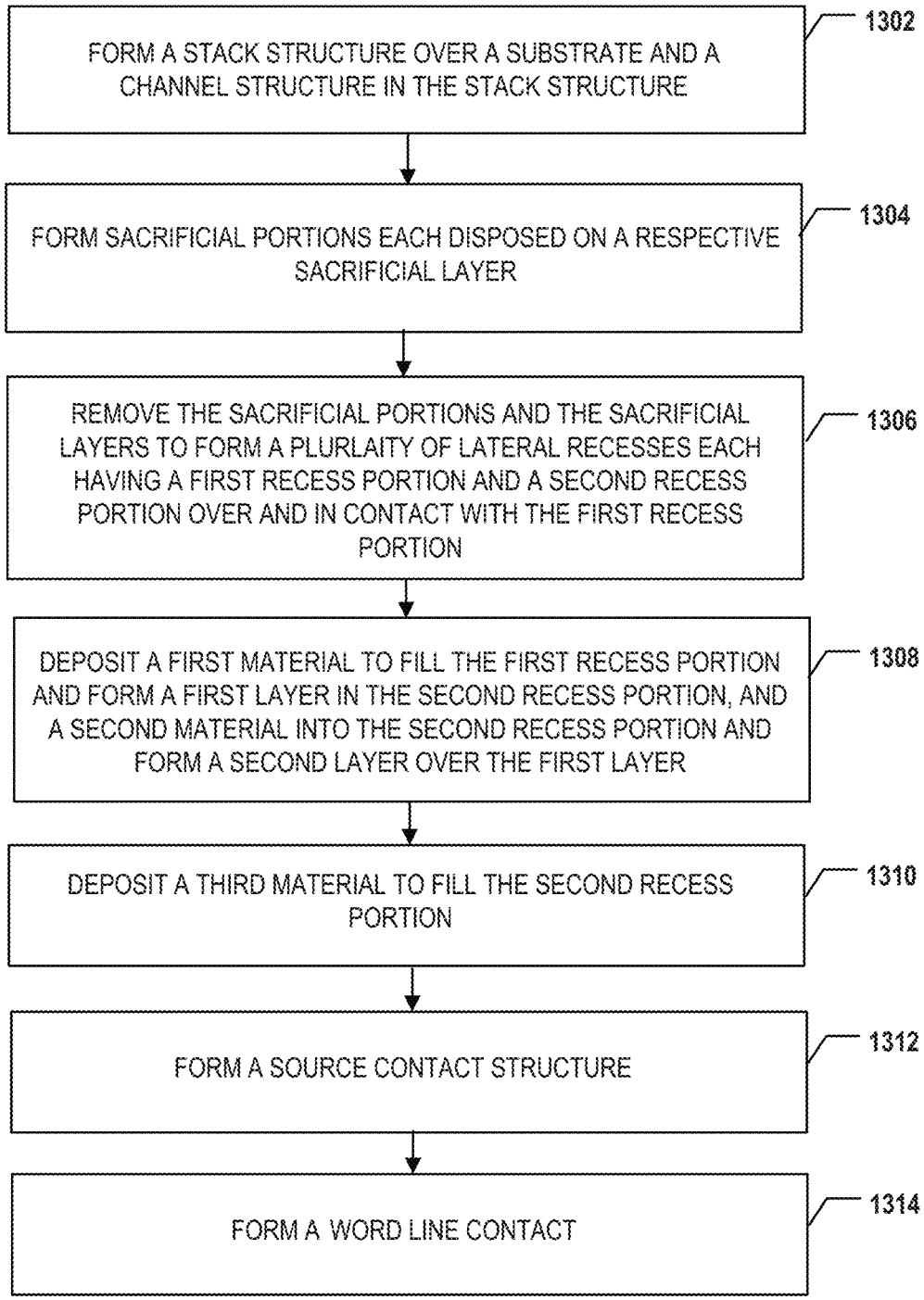
FIG. 13 illustrates a flowchart of an exemplary method for forming a 3D memory device, according to some aspects of the present disclosure.

FIGS. 3A, 3B, 4A, 4B, 5A, 5B, 6A, 6B, 7A, 7B, 8A, 8B, 9A, 9B, 10A, 10B, 11A, 11B, 12A, and 12B illustrate cross-sections of a 3D memory device at different stages of a fabrication process, according to some aspects of the present disclosure. The 3D memory device may be an example of 3D memory device 200 or 201. FIG. 13 illustrates a flowchart of an exemplary method 1300 for forming the 3D memory device, according to some aspects of the present disclosure. For the purpose of better describing the present disclosure, the structures in FIGS. 3A-12B and method 1300 in FIG. 13 will be discussed together. It is understood that the operations shown in method 1300 are not exhaustive and that other operations may be performed as well before, after, or between any of the illustrated operations. Further, some of the operations may be performed simultaneously, or in a different order than shown in FIGS. 3A-12B and FIG. 13.

Figures 3A, 3B:
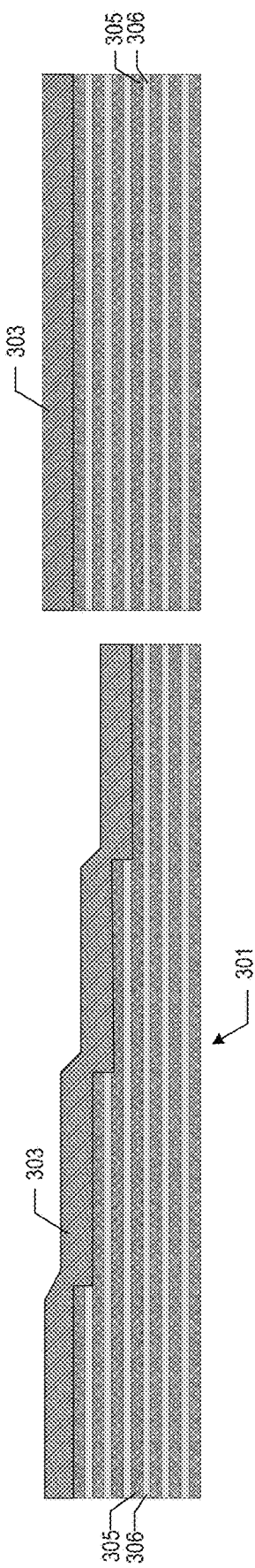

As shown in FIG. 13, method 1300 starts at operation 1302, in which a stack structure is formed over a substrate, and a channel structure is formed in the stack structure. FIGS. 3A and 3B illustrate a corresponding structure.

As shown in FIGS. 3A and 3B, a stack structure 301 can be formed on a substrate (not shown). Stack structure 301 can include a dielectric stack having a plurality of interleaved sacrificial layers 305 and dielectric layers 306 extending in the x-direction, forming a plurality of sacrificial/dielectric layer pairs. Edges of sacrificial/dielectric layer pairs may define a plurality of stairs. In some implementations, sacrificial layer 305 may be at a top surface of a respective stair. The dielectric stack (e.g., the stairs) may be formed by repeatedly trimming a dielectric material stack of interleaved sacrificial material layers and dielectric material layers. In some implementations, each dielectric layer 306 may include a layer of silicon oxide, and each sacrificial layer 305 may include a layer of silicon nitride. The dielectric material stack may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between the substrate and the dielectric material stack by depositing dielectric materials, such as silicon oxide, on the substrate. The trimming of the dielectric material stack may include photolithography and etching (e.g., dry and/or wet etching) processes.

Channel structures (now shown) are formed extending vertically through stack structure 301 in the z-direction. In some implementations, an etch process may be performed to form a channel hole in stack structure 301. The channel hole may extend vertically through the interleaved sacrificial layers and dielectric layers. In some implementations, fabrication processes for forming the channel hole may include wet etching and/or dry etching, such as deep reactive ion etching (DRIE). In some implementations, the channel hole may extend further into the top portion of the substrate. The etch process through stack structure 301 may not stop at the top surface of the substrate and may continue to etch part of the substrate. After the formation of the channel hole, an epitaxial operation, e.g., a selective epitaxial growth operation, may be performed to form a channel contact on the bottom of the channel hole. The channel contact, or called semiconductor plug, can include a semiconductor material, such as silicon, which is epitaxially grown from the substrate in any suitable direction. Then, the memory film, including the tunneling layer, the storage layer, the blocking layer, and the semiconductor channel can be formed. Optionally, a filling layer may be formed in the channel hole. In some implementations, the channel structure may not include a semiconductor plug. The deposition of the memory film, the semiconductor channel, and the filling layer may include any suitable thin-film deposition processes such as CVD, PVD, ALD, or any combination thereof. The deposition of the channel plug may include CVD, PVD, ALD, electroplating, electroless plating, or any combination thereof.

Method 1300 proceeds to Operation 1304, in which a plurality of sacrificial portions are formed, each on a respective sacrificial layer. FIGS. 3A, 3B, 4A, and 4B illustrate corresponding structures.

Referring back to FIGS. 3A and 3B, a layer 303 of a sacrificial material may be deposited over the stairs. Layer 303 may cover at least the landing area of each stair. Layer 303 may be in contact with the exposed sacrificial layers 305 and have the same material as that of sacrificial layers 305, such as silicon nitride. In some implementations, layer 303 may be sufficiently thick such that the subsequently-formed landing structure (e.g., referring back to landing structure 212) can sustain the over-etching in the fabrication of the word line contacts. In some implementations, a thickness of layer 303 is equal to or greater than 10 nm. The sacrificial material of layer 303 may also include other suitable materials such that the sacrificial material of layer 303 and sacrificial layers 305 may be removed in the same etching process in the subsequent gate-replacement process. The deposition of layer 303 may include any suitable thin-film deposition processes such as CVD, PVD, ALD, or any combination thereof.

Referring back to FIGS. 4A and 4B, layer 303 may be patterned to form a plurality of sacrificial portions 403 each disposed on a respective sacrificial layer 305 of a respective stair. Sacrificial portion 403 may be disposed at the landing area of the respective stair. To form sacrificial portions 403, layer 303 may be patterned to remove portions of the sacrificial material deposited on the side surfaces of the stairs. Each sacrificial portion 403 may thus be disconnected from one another. The patterning of layer 303 may include photolithography and an etching (e.g., dry and/or wet etching) process.

A dielectric material structure may be deposited over the stairs to cover sacrificial portions 403. The dielectric material structure may then be planarized to form a dielectric structure 408 covering the stairs. The deposition of the dielectric material structure may include any suitable thin-film deposition processes such as CVD, PVD, ALD, or any combination thereof. The planarization of the dielectric material structure may include a CMP and/or a recess etching process.

Method 1300 proceeds to operation 1306, in which the sacrificial layers and the sacrificial portions are removed to form a plurality of lateral recesses, each having a first recess portion and a second recess portion over and in contact with the first recess portion. FIGS. 5A and 5B illustrate a corresponding structure.

As shown in FIGS. 5A and 5B, sacrificial layers 305 and sacrificial portions 403 are removed from stack structure 301. A plurality of lateral recesses 502 may be formed, extending laterally in the x-y plane, in stack structure 301. To form lateral recesses 502, one or more slit structure 504 (e.g., gate line slit) may be formed extending through stack structure 301 in the z-direction. Slit structure 504 may extend laterally in the x-direction, referring back to FIG. 2A. Slit structure 504 may be in contact or extend into the top portion of the substrate. In some implementations, the fabrication process for forming slit structure 504 may include wet etching and/or dry etching, such as deep reactive ion etching (DRIE). An isotropic etching process, such as wet etching, may be performed through slit structure 504 to remove sacrificial layers 305 and sacrificial portions 403, forming a plurality of lateral recesses 502.

Lateral recess 502 may include a first recess portion 502-1 and a second recess portion 502-2 over and in contact with first recess portion 502-1. First recess portion 502-1 may be formed from the removal of a respective sacrificial layer 305. In the x-direction, the length of first recess portion 502-1 is greater than that of second recess portion 502-2. In some implementations, first recess portion 502-1 extends laterally to the edge of the respective stair and also intersects with channel structures in stack structure 301. Second recess portion 502-2 may be formed by the removal of a respective sacrificial portion 403, and is disposed in the landing area of a respective stair. In other words, first recess portion 502-1 and second recess portion 502-2 form a hollow space at the landing area of the respective stair.

Figures 6A, 6B:
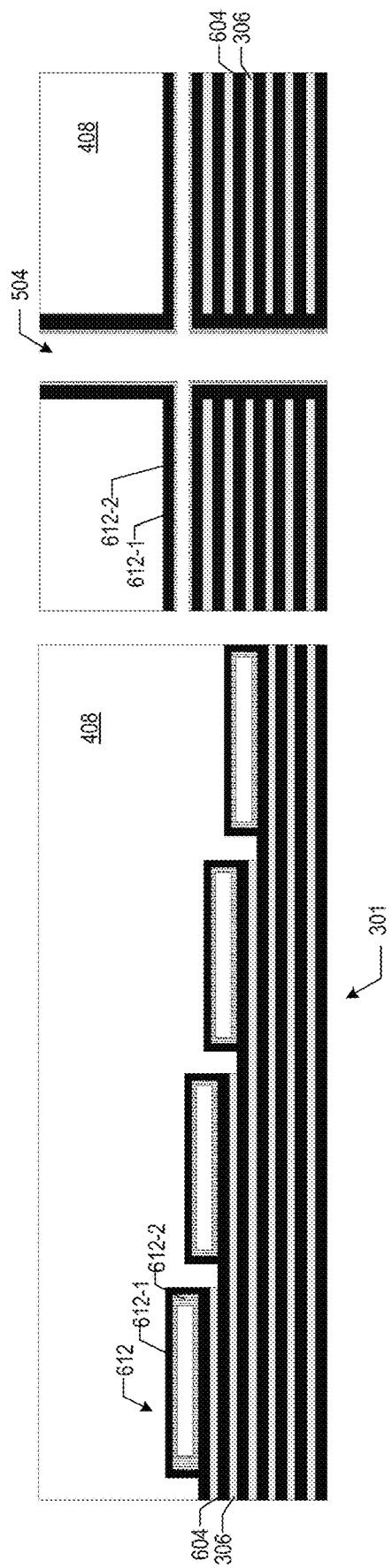

Referring back to FIG. 13, method 1300 proceeds to operation 1308, in which a first material is deposited into each of the lateral recesses to fill the first recess portion and form a first layer in the second recess portion, and a second material is deposited into each second recess portion to form a second layer over the first layer in the second recess portion. FIGS. 6A and 6B illustrate a corresponding structure.

As shown in FIGS. 6A and 6B, a first material may be deposited through slit structure 504 into lateral recesses 502 to fill first recess portions 502-1 and form a first layer 612-1 in each second recess portion 502-2. A second material may be deposited through slit structure 504 into second recess portion 502-2 to form a second layer 612-2 over first layer 612-1. The first material, e.g., a conductive material, may be deposited through slit structure 504 to fill each first recess portion 502-1. In some implementations, the first material fills at least the part of first recess portions 502-1 that located in the core array region (e.g., being intersecting with the channel structures) of the 3D memory structure. In some implementations, the first material fills an entire first recess portion 502-1, extending from the edge of the stair to the core array region, and a conductive layer 604 (e.g., a word line) is formed. First layer 612-1 may be over the side surfaces (e.g., upper lateral surface and vertical surfaces) of second recess portion 502-2. First layer 612-1 may thus include a lateral portion and a pair of vertical portions. First layer 612-1 may be in contact with conductive layer 604 at the vertical portions. First layer 612-1 partially fills second recess portion 502-2.

Second layer 612-2 may be deposited over first layer 612-1 and the underlying conductive layer 604, in second recess portion 502-2. As an example, FIGS. 6A and 6B shows an scenario in which second layer 612-2 partially fills the space formed/surrounded by first layer 612-1 and the underlying conductive layer 604, referring back to 3D memory device 200. In some implementations, although not shown, second layer 612-2 may fully fill the space formed/surrounded by first layer 612-1 and the underlying conductive layer 604, referring back to 3D memory device 201. In some implementations, as shown in FIGS. 6A and 6B, when second layer 612-2 partially fills the space formed by first layer 612-1 and the underlying conductive layer 604, space (e.g., a hollow portion) may be formed in second recess portion 502-2.

The first material may include a conductive material, such as tungsten, and can be formed by any suitable thin-film deposition processes such as CVD, PVD, ALD, electroplating, electroless plating, or any combination thereof. The second material may include a different material than the first material. For example, the second material may include silicon oxide, silicon nitride, silicon oxynitride, polysilicon, carbon, or any combination thereof. In some implementations, the second material includes silicon oxide. The deposition of the second material may include any suitable thin-film deposition processes such as CVD, PVD, ALD, or any combination thereof.

As shown in FIG. 6B, the first material and the second material may also be deposited over the sidewall of slit structure 504. For example, the first material may be over dielectric structure 408 and conductive layers 604 exposed on the sidewall of slit structure 504, and the second material may be disposed over the first material. In some implementations, the second material may protect the first material on the sidewall of slit structure 504.

Referring back to FIG. 13, method 1300 proceeds to operation 1310, in which a third layer is deposited to fill the second recess portion. FIGS. 7A and 7B illustrate a corresponding structure.

As shown in FIGS. 7A and 7B, in some implementations, when the second material partially fills the space formed/surrounded by first layer 612-1 and the underlying conductive layer 604, as shown in the scenario in FIGS. 6A and 6B, a third material may be deposited, through slit structure 504, into second recess portion 502-2 to fill the space formed by the enclosure/surrounding of second layer 612-2. Third layer 612-3 is deposited when second layer 612-2 does not fully fill the space formed by first layer 612-1 and underlying conductive layer 604 in second recess portion 502-2. A third layer 612-3 may be formed over second layer 612-2, surrounded and in contact with second layer 612-2. The third material may include a conductive material, such as the same as the first material. In some implementations, the third material is different from the first material and the second material, and can be conductive or non-conductive. For example, the third material may be W, Co, Al, Cu, silicides, polysilicon, silicon oxide, silicon nitride, silicon oxynitride, carbon, or any combination thereof. The third material can be formed by any suitable thin-film deposition processes such as CVD, PVD, ALD, electroplating, electroless plating, or any combination thereof. As shown in FIG. 7B, the third material may also be deposited over the sidewall of slit structure 504. For example, the third material may be disposed over the second material. In some implementations, when the second material fully fills the space formed/surrounded by first layer 612-1 and the underlying conductive layer 604, no third material is deposited.

Referring back to FIG. 13, method 1300 proceeds to operation 1312, in which a source contact structure is formed in the slit structure. FIGS. 8A, 8B, 9A, 9B, 10A, 10B, 11A, and 11B illustrate corresponding structures.

One or more recess etching processes may be performed to remove excess materials deposited on the sidewall of slit structure 504. As shown in FIGS. 8A and 8B, if the third material is deposited, the third material on the sidewall of slit structure 504 may be removed, and third layer 612-3 in second recess portion 502-2 is retained. The second material, on the sidewall of slit structure 504, may be exposed. In some implementations, the third material includes tungsten. A suitable etching process, e.g., a dry and/or wet etching process, may be performed to remove the third material.

As shown in FIGS. 9A and 9B, the second material on the sidewall of slit structure 504 may be removed, and second layer 612-2 in second recess portion 502-2 is retained. The first material, on the sidewall of slit structure 504, may be exposed. A suitable etching process, e.g., a dry and/or wet etching process, may be performed to remove the second material.

As shown in FIGS. 10A and 10B, the first material on the sidewall of slit structure 504 may be removed, and first layer 612-1 in second recess portion 502-2 is retained. Dielectric structure 408 and conductive layers 604 may be exposed on the sidewall of slit structure 504. The etching process to remove the first material may also function as a recess etch to form a recess in each conductive layer 604 in the x-direction, from the sidewall of slit structure 504 (or from dielectric layers 306). Meanwhile, first layer 612-1 and third layer 612-3, exposed on the sidewall of slit structure 504, are also etched to form recesses from second layer 612-2, in the x-direction. That is, dielectric layers 306 and second layer 612-2 may form protrusions on the sidewall of slit structure 504. Conductive layers 604 may be disconnected from one another. The etching process may include a dry and/or wet etching process.

A source contact structure may then be formed in slit structure 504. The source contact structure may include a dielectric spacer 1118 (e.g., silicon oxide) and a source contact 1116 (e.g., W) in dielectric spacer 1118. The formation of dielectric spacer 1118 may include one or more thin filmed deposition processes such as CVD, PVD, and/or ALD. The formation of the source contact 1116 may include CVD, PVD, ALD, electroplating, electroless plating, or any combination thereof.

Referring back to FIG. 13, method 1300 proceeds to operation 1314, in which a word line contact is formed on a respective landing structure. FIGS. 12A and 12B illustrate a corresponding structure.

As shown in FIGS. 12A and 12B, a plurality of word line contacts 1210 may be formed each landed on a respective landing structure 612 of a respective stair. Word line contact 1210 may be in contact with at least first layer 612-1 of landing structure 612. In some implementations, depending on the fabrication process, word line contact 1210 may be in contact with second layer 612-2 and/or third layer 612-3 of landing structure 612. To form word line contact 1210, dielectric structure 408 may be patterned to form a plurality of openings extending in the z-direction in dielectric structure 408. Each opening may be in contact with a respective landing structure 612. A conductive material is then deposited to fill in the openings. In some implementations, a planarization process is performed on dielectric structure 408 to remove any excess material on dielectric structure 408. The etching to form the openings may include a suitable etching process such as dry and/or wet etching processes. The deposition of the conductive material may include CVD, PVD, ALD, electroplating, electroless plating, or any combination thereof. The planarization of the dielectric structure may include a CMP and/or recess etching process.

Figure 14:
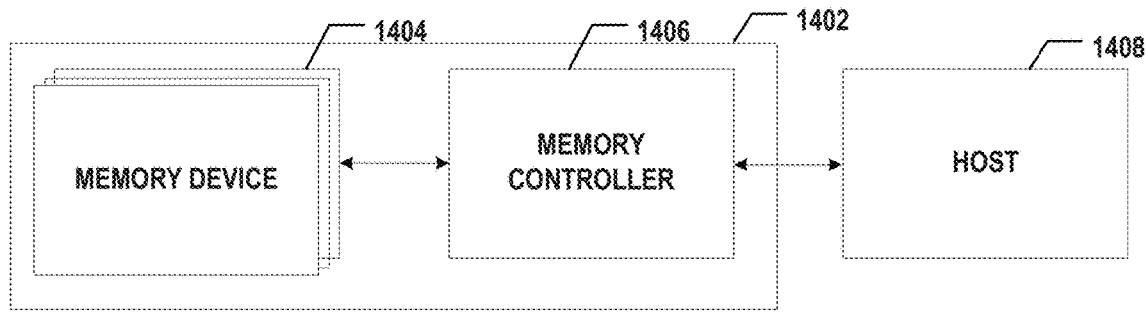
FIG. 14 illustrates a block diagram of an exemplary system having a memory device, according to some aspects of the present disclosure.

FIG. 14 illustrates a block diagram of an exemplary system 1400 having a memory device, according to some aspects of the present disclosure. System 1400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 14, system 1400 can include a host 1408 and a memory system 1402 having one or more memory devices 1404 and a memory controller 1406. Host 1408 can be a processor of an electronic device, such as a central processing unit (CPU), or a system-on-chip (SoC), such as an application processor (AP). Host 1408 can be configured to send or receive data to or from memory devices 1404.

Memory device 1404 can be any memory device disclosed in the present disclosure. As disclosed above in detail, memory device 1404, such as a NAND Flash memory device, may have a landing structure on a respective conductive layer. The landing structure has a top layer, made of a conductive material, that is desirably thin to be removed in a recess etching process and desirably thick to provide high electrical conductivity. Memory controller 1406 is coupled to memory device 1404 and host 1408 and is configured to control memory device 1404, according to some implementations. Memory controller 1406 can manage the data stored in memory device 1404 and communicate with host 1408. For example, memory controller 1406 may be coupled to memory device 1404, such as 3D memory devices 200 and/or 201 described above, and memory controller 1406 may be configured to control operations of the channel structures in 3D memory device 200/201 such as the application of word line voltages on the landing structures and the conductive materials.

In some implementations, memory controller 1406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1406 can be configured to control operations of memory device 1404, such as read, erase, and program operations. Memory controller 1406 can also be configured to manage various functions with respect to the data stored or to be stored in memory device 1404 including, but not limited to bad-block management, garbage collection, logical-to-physical address conversion, wear leveling, etc. In some implementations, memory controller 1406 is further configured to process error correction codes (ECCs) with respect to the data read from or written to memory device 1404. Any other suitable functions may be performed by memory controller 1406 as well, for example, formatting memory device 1404.

Memory controller 1406 can communicate with an external device (e.g., host 1408) according to a particular communication protocol. For example, memory controller 1406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 15A, 15B:
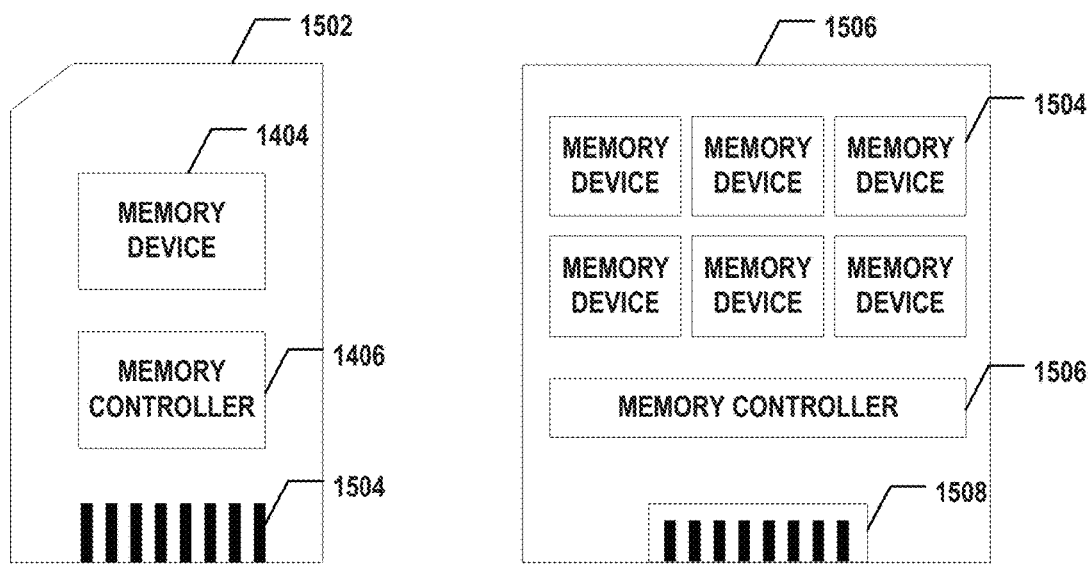
FIG. 15A illustrates a diagram of an exemplary memory card having a memory device, according to some aspects of the present disclosure.
FIG. 15B illustrates a diagram of an exemplary solid-state drive (SSD) having a memory device, according to some aspects of the present disclosure.

Memory controller 1406 and one or more memory devices 1404 can be integrated into various types of storage devices, for example, be included in the same package, such as a universal Flash storage (UFS) package or an eMMC package. That is, memory system 1402 can be implemented and packaged into different types of end electronic products. In one example as shown in FIG. 15A, memory controller 1406 and a single memory device 1404 may be integrated into a memory card 1502. Memory card 1502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1502 can further include a memory card connector 1504 coupling memory card 1502 with a host (e.g., host 1408 in FIG. 14). In another example as shown in FIG. 15B, memory controller 1406 and multiple memory devices 1404 may be integrated into an SSD 1506. SSD 1506 can further include an SSD connector 1508 coupling SSD 1506 with a host (e.g., host 1408 in FIG. 14). In some implementations, the storage capacity and/or the operation speed of SSD 1506 is greater than those of memory card 1502.

According to one aspect of the present disclosure, a 3D memory device includes interleaved conductive layers and dielectric layers. Edges of the conductive layers and dielectric layers define a plurality of stairs. The 3D memory device may also include a plurality of landing structures each disposed on a respective conductive layer at a respective stair. Each of the landing structures comprises a first layer of a first material and a second layer of a second material. The first layer is over the second layer. The second material is different from the first material.

In some implementations, the first material includes a conductive material.

In some implementations, the first material includes tungsten.

In some implementations, the second material includes silicon oxide, silicon nitride, silicon oxynitride, polysilicon, or a combination thereof.

In some implementations, the first layer is in contact with the respective conductive layer and surrounds the second layer laterally and vertically.

In some implementations, the landing structures each further includes a third layer surrounded by the second layer. The third layer includes a third material.

In some implementations, the third material is a conductive material.

In some implementations, the third material is the same as the first material.

In some implementations, the first layer is over side surfaces of the respective landing structure, and the second layer fills a rest of the respective landing structure.

In some implementations, the first layer includes tungsten, the second layer includes silicon nitride, and the respective conductive layer includes tungsten.

In some implementations, the first layer includes tungsten, the second layer includes polysilicon, and the respective conductive layer includes tungsten.

In some implementations, the first layer is over side surfaces of the respective landing structure, the second layer is over side surfaces of the first layer and the respective conductive layer, and the third layer fills a rest of the respective landing structure.

In some implementations, the first layer includes tungsten, the second layer includes silicon oxide, the third layer includes tungsten, and the respective conductive layer includes tungsten.

In some implementations, the conductive layers each includes the first material.

According to another aspect of the present disclosure, a memory system includes a 3D memory device that includes interleaved conductive layers and dielectric layers. Edges of the conductive layers and dielectric layers define a plurality of stairs. The 3D memory device also includes a plurality of landing structures each disposed on a respective conductive layer at a respective stair. Each of the landing structures includes a first layer of a first material and a second layer of a second material. The first layer is over the second layer. The second material is different from the first material. The memory system may also include a memory controller coupled to the 3D memory device and configured to control operations of the 3D memory device.

In some implementations, the first material includes a conductive material, and the second material is different from the first material.

In some implementations, the first layer is in contact with the respective conductive layer and surrounds the second layer laterally and vertically.

In some implementations, the first layer is over side surfaces of the respective landing structure; and the second layer fills a rest of the respective landing structure.

In some implementations, the first layer includes tungsten, the second layer includes silicon nitride, and the respective conductive layer includes tungsten.

In some implementations, the first layer includes tungsten, the second layer includes polysilicon, and the respective conductive layer includes tungsten.

In some implementations, the landing structures each further includes a third layer surrounded by the second layer. The third layer includes a material as the first layer.

In some implementations, the third layer fills a rest of the respective landing structure.

In some implementations, first layer includes tungsten, the second layer includes silicon oxide, the third layer includes tungsten, and the respective conductive layer includes tungsten.

According to another aspect of the present disclosure, a method for forming a 3D memory device includes the following operations. A stack structure having interleaved sacrificial layers and dielectric layers is formed. Edges of the sacrificial layers and dielectric layers define a plurality of stairs. Sacrificial portions are formed each in contact with a respective sacrificial layer. The sacrificial portions and the sacrificial layers are removed to form lateral recesses each having a first recess portion and a second recess portion over and in contact in contact with the first recess portion. A first material is deposited into each of the lateral recesses to fill the first recess portion and form a first layer in the second recess portion. A second material is deposited into the second recess portion to form a second layer over the first layer in the second recess portion.

In some implementations, depositing the first material includes depositing a conductive material to form the first layer on side surfaces of the second recess portion.

In some implementations, depositing the first material includes depositing tungsten.

In some implementations, depositing the second material includes depositing a material different from the first material.

In some implementations, depositing the second material includes depositing silicon oxide, silicon nitride, silicon oxynitride, polysilicon, or a combination thereof.

In some implementations, the second material is deposited over and in contact with the first layer in the second recess portion.

In some implementations, the second material is deposited over the first layer and fills the second recess portion.

In some implementations, the method further includes depositing a third material into the second recess portion to form a third layer over the second layer in the second recess portion.

In some implementations, depositing the third material includes depositing the first material.

In some implementations, the third material is deposited over the second layer and fills the second recess portion.

In some implementations, the method further includes forming a slit structure in the interleaved sacrificial layers and dielectric layers, and performing an isotropic etching process to remove the sacrificial layers and the sacrificial portions to form the lateral recesses.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
    interleaved conductive layers and dielectric layers, wherein edges of the conductive layers and dielectric layers define a plurality of stairs; and
    a plurality of landing structures each disposed on a respective conductive layer at a respective stair,
    wherein:
    each of the landing structures comprises a first layer of a first material and a second layer of a second material, the first layer being over the second layer, the second material being different from the first material; and
    the first layer surrounds the second layer laterally and vertically.

2. The 3D memory device of claim 1, wherein the first material comprises a conductive material.

3. The 3D memory device of claim 1, wherein the first material comprises tungsten.

4. The 3D memory device of claim 1, wherein the second material comprises silicon oxide, silicon nitride, silicon oxynitride, polysilicon, or a combination thereof.

5. The 3D memory device of claim 1, wherein the first layer is in contact with the respective conductive layer.

6. The 3D memory device of claim 5, wherein
    the first layer is over side surfaces of the respective landing structure; and
    the second layer fills a rest of the respective landing structure.

7. The 3D memory device of claim 6, wherein the first layer comprises tungsten, the second layer comprises silicon nitride, and the respective conductive layer comprises tungsten.

8. The 3D memory device of claim 6, wherein the first layer comprises tungsten, the second layer comprises polysilicon, and the respective conductive layer comprises tungsten.

9. The 3D memory device of claim 1, wherein the landing structures each further comprises a third layer surrounded by the second layer, the third layer comprising a third material.

10. The 3D memory device of claim 9, wherein the third material is a conductive material.

11. The 3D memory device of claim 9, wherein the third material is the same as the first material.

12. The 3D memory device of claim 9, wherein
    the first layer is over side surfaces of the respective landing structure;
    the second layer is over side surfaces of the first layer and the respective conductive layer; and
    the third layer fills a rest of the respective landing structure.

13. The 3D memory device of claim 12, wherein the first layer comprises tungsten, the second layer comprises silicon oxide, the third layer comprises tungsten, and the respective conductive layer comprises tungsten.

14. A memory system, comprising:
    a three-dimensional (3D) memory device, comprising:
        interleaved conductive layers and dielectric layers, wherein edges of the conductive layers and dielectric layers define a plurality of stairs; and
        a plurality of landing structures each disposed on a respective conductive layer at a respective stair,
        wherein:
        each of the landing structures comprises a first layer of a first material and a second layer of a second material, the first layer being over the second layer, the second material being different from the first material; and
        the first layer is in contact with the respective conductive layer and surrounds the second layer laterally and vertically; and
    a memory controller coupled to the 3D memory device and configured to control operations of the 3D memory device.

15. A three-dimensional (3D) memory device, comprising:
    interleaved conductive layers and dielectric layers, wherein edges of the conductive layers and dielectric layers define a plurality of stairs; and
    a plurality of landing structures each disposed on a respective conductive layer at a respective stair,
    wherein:
    each of the landing structures comprises a first layer of a first material and a second layer of a second material, the second material being different from the first material; and
    the first layer is arranged above a respective conductive layer and the second layer, and surrounds the second layer laterally and vertically.

16. The 3D memory device of claim 15, wherein the second layer extends horizontally above the respective conductive layer.

17. The 3D memory device of claim 15, wherein:
the first material comprises a conductive material; and
the second material comprises silicon oxide, silicon nitride, silicon oxynitride, polysilicon, or a combination thereof.

18. The 3D memory device of claim 15, wherein each of the landing structures further comprises a third layer surrounded by the second layer.

19. The 3D memory device of claim 15, wherein the first layer comprises a horizontal portion arranged above the second layer, and a vertical portion surrounding the second layer vertically.

20. The 3D memory device of claim 15, wherein the first layer and the second layer are in direct contact with a same layer of the respective conductive layer.

* * * * *